United States Patent [19]
Rockenfeller et al.

[11] Patent Number: 5,666,819
[45] Date of Patent: *Sep. 16, 1997

[54] RAPID SORPTION COOLING OR FREEZING APPLIANCE

[75] Inventors: Uwe Rockenfeller; Lance D. Kirol, both of Boulder City, Nev.

[73] Assignee: Rocky Research, Boulder City, Nev.

[*] Notice: The term of this patent shall not extend beyond the expiration date of Pat. Nos. 5,628,255 and 5,664,427.

[21] Appl. No.: 604,762

[22] Filed: Feb. 23, 1996

Related U.S. Application Data

[63] Continuation of Ser. No. 328,847, Oct. 25, 1994, which is a continuation-in-part of Ser. No. 149,453, Nov. 9, 1993, Pat. No. 5,396,775, which is a division of Ser. No. 794,501, Nov. 19, 1991, Pat. No. 5,271,239, which is a continuation-in-part of Ser. No. 732,652, Jul. 19, 1991, Pat. No. 5,186,020, which is a continuation-in-part of Ser. No. 644,833, Jan. 23, 1991, abandoned, and a continuation-in-part of Ser. No. 104,427, Aug. 9, 1993, Pat. No. 5,441,716, which is a continuation-in-part of Ser. No. 931,036, Aug. 14, 1992, Pat. No. 5,328,671, and a continuation-in-part of Ser. No. 975,973, Nov. 13, 1992, Pat. No. 5,298,231, which is a continuation of Ser. No. 320,562, Mar. 8, 1989, abandoned.

[51] Int. Cl.⁶ .......................................... F25B 17/08
[52] U.S. Cl. ........................... 62/480; 62/112; 95/121; 95/900
[58] Field of Search ........................ 62/476, 480–494, 62/101, 112; 423/299, 352; 95/128, 121–139, 137, 141, 116, 900

[56] References Cited

U.S. PATENT DOCUMENTS

| | | |
|---|---|---|
| 992,560 | 5/1911 | Heuser. |
| 1,686,425 | 10/1928 | Von Platen et al.. |
| 1,833,901 | 12/1931 | Hull. |
| 1,881,568 | 10/1932 | Henney. |
| 1,892,407 | 12/1932 | Miller. |
| 1,932,492 | 9/1933 | Smith. |

(List continued on next page.)

FOREIGN PATENT DOCUMENTS

| | | |
|---|---|---|
| 664520 | 9/1965 | Belgium. |
| 0196863 | 8/1986 | European Pat. Off.. |
| 0193747 | 10/1986 | European Pat. Off.. |
| 0470886 | 2/1992 | European Pat. Off.. |
| 2604100 | 9/1986 | France. |
| 436988 | 11/1926 | Germany. |
| 417044 | 12/1932 | United Kingdom. |
| 415488 | 3/1933 | United Kingdom. |
| 424456 | 4/1934 | United Kingdom. |
| 8500213 | 1/1985 | WIPO. |
| 9010491 | 9/1990 | WIPO. |

OTHER PUBLICATIONS

Revue Phys. Appl., vol. 18 (1983), pp. 107–112, Mauran et al.

Refrigerating Engineering. "Absorption Refrigeration with Solid Absorbents", by R.M. Buffington, pp. 137–142 (Sep., 1933).

Refrigerating Engineering. "Comfort Cooling in a Refrigerating Plant", by R.H. Smith, p. 152 (Sep., 1933).

Primary Examiner—William Doerrler
Attorney, Agent, or Firm—Jerry R. Seiler, Esq.

[57] ABSTRACT

An apparatus capable of providing rapid cooling and/or freezing comprises a cabinet or container having a cooling chamber, one or more reactors each containing a complex compound formed by adsorbing a polar gas on a metal salt, in which the polar gas is alternately adsorbed and desorbed on the complex compound, and in which the complex compound is formed by restricting the volumetric expansion and controlling the density during adsorption of the polar gas on the metal salt, whereby the complex compound is capable of adsorbing said polar gas at a rate of greater than 15 moles per mole hour of the complex compound in about 20 minutes or less, a condenser for condensing the polar gas, an evaporator thermally exposed to the cooling chamber for providing cooling therein, and conduits and one or more valves for directing said polar gas from the one or more reactors to the condenser, from the condenser to the evaporator and from the evaporator to the one or more reactors.

34 Claims, 2 Drawing Sheets

U.S. PATENT DOCUMENTS

| | | |
|---|---|---|
| 1,972,426 | 9/1934 | Noebel . |
| 1,987,911 | 1/1935 | Prickett . |
| 1,992,745 | 2/1935 | Elfuing . |
| 2,004,503 | 6/1935 | Hulse . |
| 2,019,356 | 10/1935 | Normelli . |
| 2,067,678 | 1/1937 | Nesselmann . |
| 2,088,276 | 12/1937 | Nesselmann et al. . |
| 2,167,264 | 6/1939 | Dunz . |
| 2,187,011 | 1/1940 | Braden . |
| 2,196,021 | 4/1940 | Merrill . |
| 2,241,600 | 5/1941 | Hunsicker . |
| 2,253,907 | 8/1941 | Levine . |
| 2,287,172 | 6/1942 | Harrison . |
| 2,326,130 | 7/1943 | Kleen . |
| 2,384,460 | 10/1945 | Kleen . |
| 2,496,459 | 2/1950 | Kleen . |
| 2,521,538 | 9/1950 | Rees . |
| 2,537,720 | 1/1951 | Wagner . |
| 2,557,373 | 6/1951 | Coons . |
| 2,587,996 | 3/1952 | Gross . |
| 2,649,700 | 8/1953 | Piper . |
| 2,715,817 | 8/1955 | Brodheim . |
| 2,801,706 | 8/1957 | Asker . |
| 2,945,554 | 7/1960 | Berly . |
| 2,989,383 | 6/1961 | Miller . |
| 3,167,399 | 1/1965 | Hansen, Jr. . |
| 3,280,591 | 10/1966 | Webster . |
| 3,411,318 | 11/1968 | Puckett . |
| 3,585,810 | 6/1971 | Sander . |
| 4,051,509 | 9/1977 | Beriger et al. . |
| 4,183,227 | 1/1980 | Bouvin et al. . |
| 4,199,959 | 4/1980 | Wurm . |
| 4,205,531 | 6/1980 | Brunberg et al. . |
| 4,285,027 | 8/1981 | Mori et al. . |
| 4,419,107 | 12/1983 | Roydhouse . |
| 4,468,717 | 8/1984 | Mathias et al. . |
| 4,523,635 | 6/1985 | Nishizaki et al. . |
| 4,546,619 | 10/1985 | Rohner . |
| 4,548,046 | 10/1985 | Brandon et al. . |
| 4,581,049 | 4/1986 | Januschkowetz . |
| 4,602,679 | 7/1986 | Edelstein et al. . |
| 4,623,018 | 11/1986 | Takeshita et al. . |
| 4,637,218 | 1/1987 | Tchernev . |
| 4,638,646 | 1/1987 | Koseki et al. . |
| 4,694,659 | 9/1987 | Shelton . |
| 4,709,558 | 12/1987 | Matsushita et al. . |
| 4,722,194 | 2/1988 | Kantor . |
| 4,759,191 | 7/1988 | Thomas et al. . |
| 4,765,395 | 8/1988 | Paeye et al. . |
| 4,801,308 | 1/1989 | Keefer . |
| 4,822,391 | 4/1989 | Rockenfeller . |
| 4,848,944 | 7/1989 | Rockenfeller . |
| 4,875,915 | 10/1989 | Rockenfeller . |
| 4,881,376 | 11/1989 | Yonezawa et al. . |
| 4,885,016 | 12/1989 | Griffiths . |
| 4,901,535 | 2/1990 | Sabin et al. . |
| 4,906,258 | 3/1990 | Balat et al. . |
| 4,944,159 | 7/1990 | Crozat . |
| 4,949,549 | 8/1990 | Steidl et al. . |
| 4,956,977 | 9/1990 | Maier-Laxhuber et al. . |
| 4,958,055 | 9/1990 | Shim . |
| 4,974,419 | 12/1990 | Sabin et al. . |
| 4,976,117 | 12/1990 | Crozat et al. . |
| 4,993,239 | 2/1991 | Steidl et al. . |
| 5,024,064 | 6/1991 | Yonezawa et al. . |
| 5,038,581 | 8/1991 | Maier-Laxhuber et al. . |
| 5,057,132 | 10/1991 | Lebrun et al. . |
| 5,186,020 | 2/1993 | Rockenfeller et al. . |
| 5,298,231 | 3/1994 | Rockenfeller . |
| 5,328,671 | 7/1994 | Rockenfeller . |

RAPID SORPTION COOLING OR FREEZING APPLIANCE

This application is a continuation of U.S. patent application Ser. No. 08/328,847, filed Oct. 25, 1994, which was a continuation-in-part of U.S. patent application Ser. No. 08/149,453, filed Nov. 9, 1993, now U.S. Pat. No. 5,396,775 which was a divisional of U.S. patent application Ser. No. 794,501, filed Nov. 19, 1991, now U.S. Pat. No. 5,271,239, which was a continuation-in-part of U.S. patent application Ser. No. 732,652, filed Jul. 19, 1991, now U.S. Pat. No. 5,186,020, which was a continuation-in-part of U.S. patent application Ser. No. 644,833, filed Jan. 23, 1991, now abandoned, and a continuation-in-part of U.S. patent application Ser. No. 08/104,427, filed Aug. 9, 1993, now U.S. Pat. No. 5,441,716, which was a continuation-in-part of U.S. patent application Ser. No. 07/931,036, filed Aug. 14, 1992, now U.S. Pat. No. 5,328,671) and Ser. No. 07/975,973, filed Nov. 13, 1992, now U.S. Pat. No. 5,298,231, which was a continuation of U.S. patent application Ser. No. 07/320,562, filed Mar. 8, 1989, now abandoned.

BACKGROUND OF THE INVENTION

In the aforesaid patents and applications there are disclosed improved apparatus and methods for achieving high adsorption/desorption reaction rates between polar gases and certain metal salts. These adsorption/desorption reactions, often referred to as "absorption" or "chemisorption" in technical literature, yield complex compounds which are the basis for efficient refrigeration, thermal storage, heat pump and power systems having high energy density. The aforesaid disclosed methods result in increased or maximized reaction rates between the gas and the complex compound, i.e., the time it takes to adsorb or desorb a given amount of the gas into or from the complex compound, to yield increased or improved power that can be delivered by the system, i.e., more energy delivered over a period of time, which translates into greater cooling capability of the apparatus. In the aforesaid U.S. Pat. Nos. 5,328,671 and 5,290,231, improved complex compound reactors are disclosed in which the complex compound adsorbents are those created by optimizing the density of the complex compound by limiting its volumetric expansion formed during at least the initial adsorption reaction between the metal salt and the polar gas. The resulting complex compounds are those in which the adsorption and desorption reaction rates are increased as compared to reaction rates using a complex compound formed without restricting the volumetric expansion and controlling the density during such a reaction. The increase in the reaction rates is expressed as an increase in the number of moles of polar gas adsorbed and/or desorbed per mole of the complex compound per hour at adsorption or desorption cycle times of less than 60 minutes. The description of such methods, reactors and complex compounds of the aforesaid patents and applications are incorporated herein by reference.

In the aforesaid application Ser. No. 104,427 there are disclosed further improved methods and apparatus for achieving improved reaction rates incorporating sorption reactors having thermal and mass diffusion path lengths within important defined limits. The reactors and resulting reactions are capable of achieving a maximum power density per mass of adsorbent, maximum power density per mass of reactor and maximum power density per desired or needed reactor volume. The specific reaction parameters and apparatus features and components including heat and mass transfer path length ranges for achieving such results as described in the aforesaid application are incorporated herein by reference.

In U.S. Pat. No. 5,161,389 there is disclosed an appliance capable of rapidly cooling or freezing a composition placed in the cooling chamber of the appliance and which apparatus comprises a combination of components including reactors containing complex compounds of ammonia and metal salt. The reactors comprise first and second reactors containing a complex compound of ammonia and a metal salt, an evaporator and a condenser for the ammonia refrigerant, and which appliance is operated by alternately and continuously adsorbing and desorbing the ammonia refrigerant between the reactors via the evaporator and condenser.

SUMMARY OF THE INVENTION

In one embodiment of the invention, the cooling apparatus is capable of selective intermittent or batch operation for rapid cooling or freezing and uses a single reactor, or bank of reactors, containing a complex compound (or mixtures of complex compounds), a condenser for condensing the refrigerant and an evaporator for providing cooling to the cooling chamber. The apparatus may also include a reservoir for accumulating condensed refrigerant. The apparatus is charged by desorbing the refrigerant from the reactor(s) to the condenser. The apparatus is selectively operated for intermittent or batch rapid cooling or freezing by discharging the refrigerant from the condenser or reservoir through the evaporator to the reactor(s) for rapid adsorption. Alternatively, the evaporator is provided with condensed refrigerant which is then evaporated and fed to the reactor(s) to perform the cooling/freezing operation. In another embodiment, one or more pairs of reactors are used, one reactor for adsorbing the refrigerant while the other reactor desorbs the refrigerant, which apparatus is capable of providing continuous cooling or freezing. In another embodiment, the apparatus comprises one or more first and second reactors, the first and second reactors each containing a different complex compound, the first reactor(s) comprising a relatively cool temperature reactor acting in the capacity of the evaporator in the cooling chamber, with the second reactor(s) operating at higher temperature and installed outside, away from the cooling chamber. The apparatus is charged by desorbing the polar gas from the high temperature second reactor(s) to adsorption in the first reactor(s). The polar gas refrigerant is then selectively desorbed from the first reactor(s) to the second reactor(s) with the endothermic desorption providing rapid cooling or freezing. The reactors used in the aforesaid apparatus are designed and configured to yield maximized or optimized reaction rates. Improved reaction rates and high power density are also achieved by restricting volumetric expansion and controlling the density of the complex compound in the reactor.

DETAILED DESCRIPTION OF THE DRAWINGS

Figure 2:
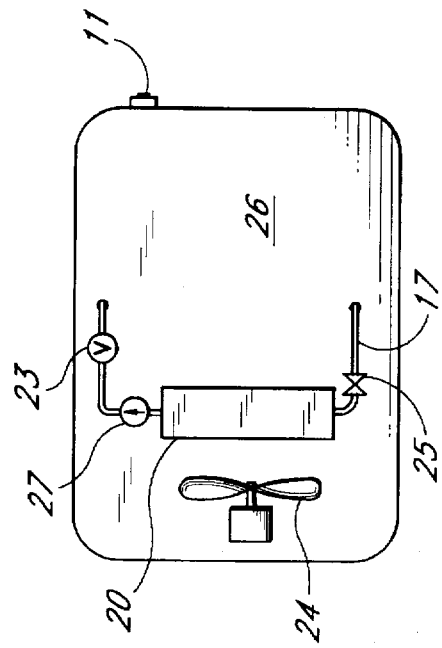
Figure 4:
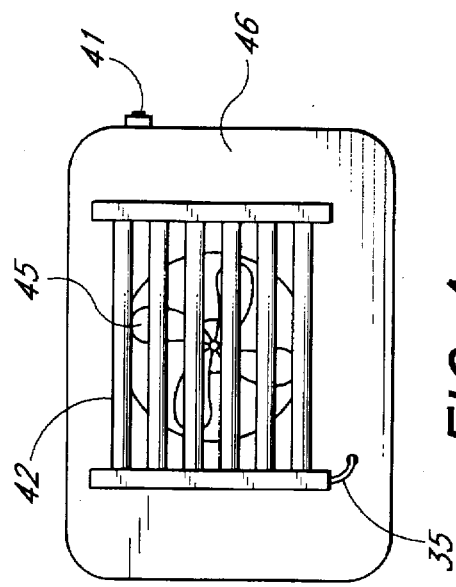
Figure 1:
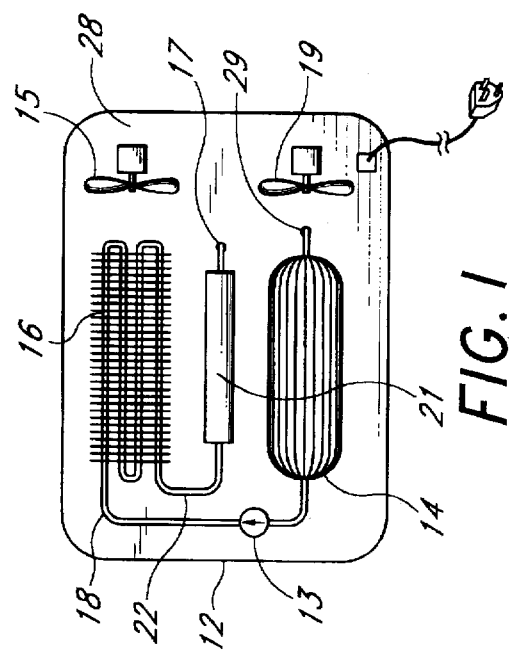
Figure 3:
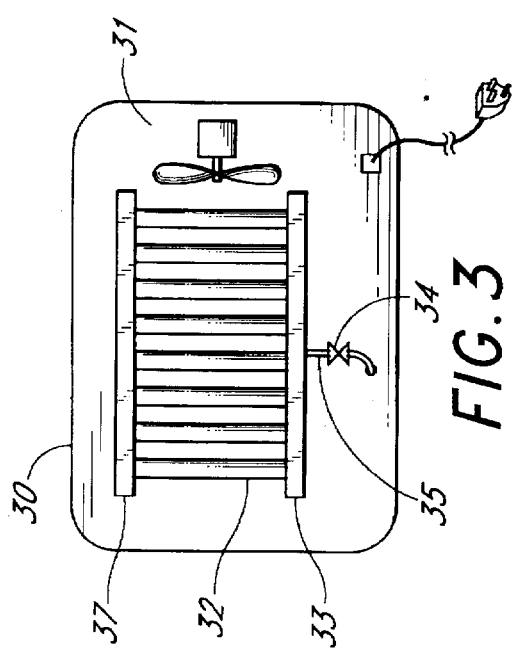
Figure 5:
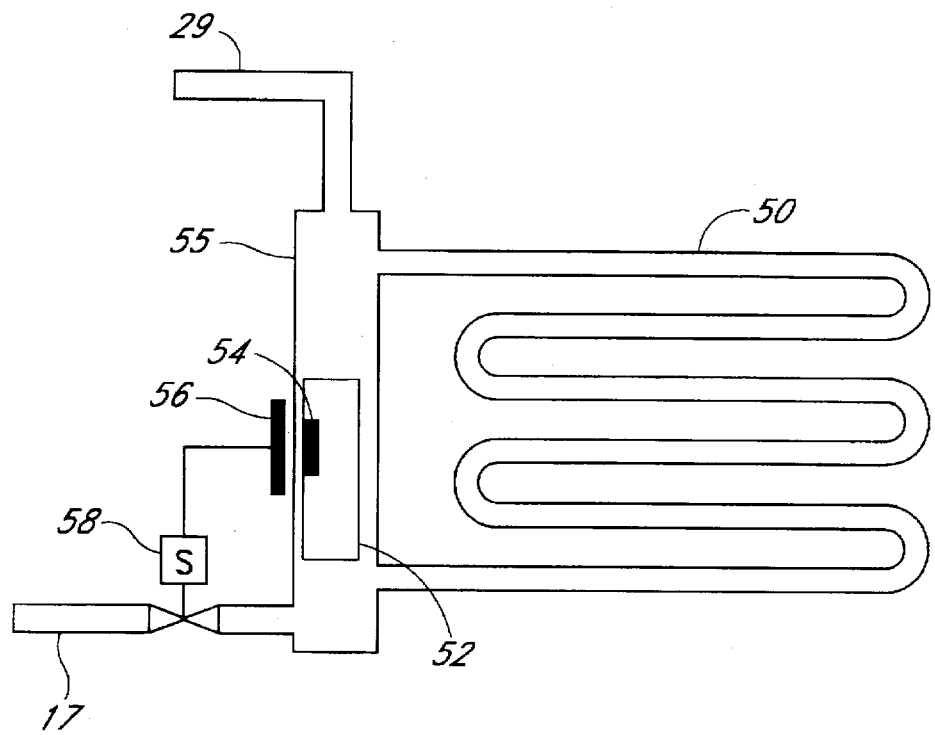
Figure 6:
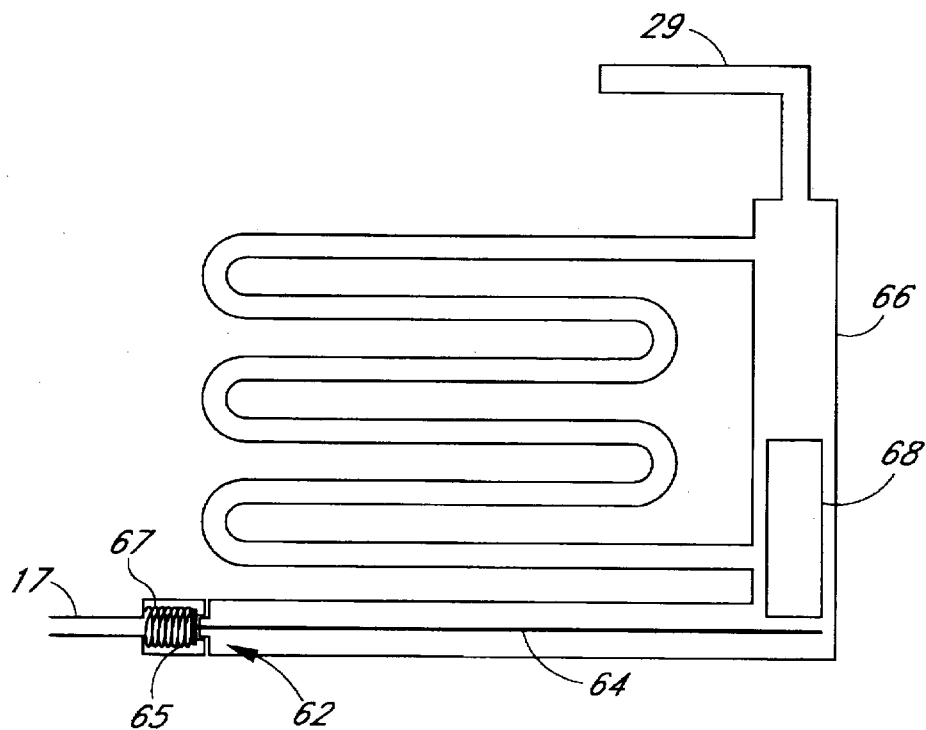

FIGS. 1 and 2 schematically illustrate a first embodiment of the invention, FIG. 1 showing the reactor, reservoir and condenser components mounted outside of the cooling chamber, and FIG. 2 the evaporator on the inside of the cooling chamber;

FIGS. 3 and 4 illustrate another embodiment of the invention, FIG. 3 showing the high temperature reactor assembly mounted outside of the cooling chamber, and FIG. 4 the cool temperature reactor assembly inside the cooling chamber for achieving rapid cooling or freezing; and FIGS. 5 and 6 illustrate evaporator assemblies including float control devices for feeding refrigerant to the evaporator.

DETAILED DESCRIPTION OF THE INVENTION

The cooling apparatus of the present invention comprises an appliance, in the form of a freezer or refrigerator having a cooling chamber in which a composition or product to be rapidly cooled or frozen is placed. Such an appliance includes a cabinet or container having a compartment or cooling chamber which can be accessed through an open door or lid. The evaporator, or the cooling reactor, is thermally exposed to the cooling chamber with an air handling component or fan for circulating the air within the cooling chamber across the evaporator or cooling reactor fins or cooling components of a cooperating heat exchanger.

According to the improvement of the invention, the rapid cooling or freezing apparatus utilizes a solid-vapor sorption reactor or reactors containing a complex compound formed by absorbing a polar gas on a metal salt and in which the adsorption reaction has been carried out by restricting the volumetric expansion of the complex compound formed. The polar gas refrigerant used in the chemisorption reactions is capable of forming covalent coordinative bond with the salt. The complex compounds are those disclosed in U.S. Pat. No. 4,848,994, the description of which is incorporated herein by reference, as are those described in the aforesaid incorporated co-pending applications. The preferred polar gaseous reactants are ammonia, water, sulfur dioxide, lower alkanols ($C_1$–$C_5$), alkylamines, polyamines and phosphine. Preferred metal salts include the nitrates, nitrites, perchlorates, oxalates, sulfates, sulfites and halides, particularly chlorides, bromides and iodides of alkali metals, alkaline earth metals, transition metals, particularly chromium, manganese, iron, cobalt, nickel, copper, tantalum and rhenium, as well as zinc, cadmium, tin and aluminum. Double metal chloride salts, in which at least one of the metals is an alkali or alkaline earth metal, aluminum, chromium, copper, zinc, tin, manganese, iron, nickel or cobalt are also useful. Another salt of special interest is NABS. Other useful complex compounds are disclosed in U.S. Pat. Nos. 5,186,020 and 5,263,330, incorporated herein by reference. Preferred complex compounds used in the reaction of the invention are the following or comprise adsorption/desorption compositions containing at least one of the following as a component with the most preferred complex compounds comprising ammoniated complexes of $SrBr_2$, $CaBr_2$, $CoCl_2$, $FeCl_2$ and $FeBr_2$:

TABLE I

| Complex Compound | X Value |
|---|---|
| $SrCl_2 \cdot X\ (NH_3)$ | 0–1, 1–8 |
| $CaCl_2 \cdot X\ (NH_3)$ | 0–1, 1–2, 2–4, 4–8 |
| $ZnCl_2 \cdot X\ (NH_3)$ | 0–1, 1–2, 2–4, 4–6 |
| $ZnBr_2 \cdot X\ (NH_3)$ | 0–1, 1–2, 2–4, 4–6 |
| $ZnI_2 \cdot X\ (NH_3)$ | 0–1, 1–2, 2–4, 4–6 |
| $CaBr_2 \cdot X\ (NH_3)$ | 0–1, 1–2, 2–6 |
| $CoCl_2 \cdot X\ (NH_3)$ | 0–1, 1–2, 2–6 |
| $CoBr_2 \cdot X\ (NH_3)$ | 0–1, 1–2, 2–6 |
| $CoI_2 \cdot X\ (NH_3)$ | 0–2, 2–6 |
| $BaCl_2 \cdot X\ (NH_3)$ | 0–8 |
| $MgCl_2 \cdot X\ (NH_3)$ | 0–1, 1–2, 2–6 |
| $MgBr_2 \cdot X\ (NH_3)$ | 0–1, 1–2, 2–6 |
| $MgI_2 \cdot X\ (NH_3)$ | 0–2, 2–6 |
| $FeCl_2 \cdot X\ (NH_3)$ | 0–1, 1–2, 2–6 |
| $FeBr_2 \cdot X\ (NH_3)$ | 0–1, 1–2, 2–6 |
| $FeI_2 \cdot X\ (NH_3)$ | 0–2, 2–6 |
| $NiCl_2 \cdot X\ (NH_3)$ | 0–1, 1–2, 2–6 |
| $NiBr_2 \cdot X\ (NH_3)$ | 0–1, 1–2, 2–6 |
| $NiI_2 \cdot X\ (NH_3)$ | 0–2, 2–6 |

TABLE I-continued

| Complex Compound | X Value |
|---|---|
| $SrI_2 \cdot X\ (NH_3)$ | 0–1, 1–2, 2–6, 6–8 |
| $SrBr_2 \cdot X\ (NH_3)$ | 0–1, 1–2, 2–8 |
| $SnCl_2 \cdot X\ (NH_3)$ | 0–2.5, 2.5–4, 4–9 |
| $SnBr_2 \cdot X\ (NH_3)$ | 0–1, 1–2, 2–3, 3–5, 5–9 |
| $BaBr_2 \cdot X\ (NH_3)$ | 0–1, 1–2, 2–4, 4–8 |
| $MnCl_2 \cdot X\ (NH_3)$ | 0–1, 1–2, 2–6 |
| $MnBr_2 \cdot X\ (NH_3)$ | 0–1, 1–2, 2–6 |
| $MnI_2 \cdot X\ (NH_3)$ | 0–2, 2–6 |
| $CaI_2 \cdot X\ (NH_3)$ | 0–1, 1–2, 2–6, 6–8 |
| $CrCl_2 \cdot X\ (NH_3)$ | 0–3, 3–6 |
| $LiCl \cdot X\ (NH_3)$ | 0–1, 1–2, 2–3, 3–4 |
| $LiBr \cdot X\ (NH_3)$ | 0–1, 1–2, 2–3, 3–4 |
| $NaCl \cdot X\ (NH_3)$ | 0–5 |
| $NaBr \cdot X\ (NH_3)$ | 0–5.25 |
| $NaI \cdot X\ (NH_3)$ | 0–4.5 |
| $K_2FeCl_5 \cdot X\ (NH_3)$ | 0–5, 5–6, 6–11 |
| $K_2ZnCl_4 \cdot X\ (NH_3)$ | 0–5, 5–12 |
| $Mg(ClO_4)_2 \cdot X\ (NH_3)$ | 0–6 |
| $Mg(NO_3)_2 \cdot X\ (NH_3)$ | 0–2, 2–4, 4–6 |
| $Sr(ClO_4)_2 \cdot X\ (NH_2)$ | 0–6, 6–7 |
| $CrBr_3 \cdot X\ (NH_3)$ | 0–3 |
| $CrCl_2 \cdot X\ (NH_3)$ | 0–3, 3–6 |
| $VCl_3 \cdot X\ (NH_3)$ | 0–3, 3–5, 5–6, 6–7, 7–12 |
| $AlCl_3 \cdot X\ (NH_3)$ | 0–1, 1–3, 3–5, 5–6, 6–7, 7–14 |
| $CuSO_4 \cdot X\ (NH_3)$ | 0–1, 1–2, 2–4, 4–5 |

In the reactors used in the rapid cooling or freezing apparatus of the invention, the complex compound on which the polar gas is alternately adsorbed and desorbed is capable of achieving maximum power density per mass of adsorbent, maximum power density per mass of reactor and maximum power density per desired or needed reactor volume. Such power density capabilities of the complex compound utilized in the apparatus are such that the polar reactant can be rapidly adsorbed, as well as rapidly desorbed, whereby the adsorption or desorption reaction times having improved reaction rates are carried out, at least for the discharge phase, in less than 30 minutes, preferably in less than about 20 minutes and typically between about 3 and about 15 minutes. The specific reaction rates, sometimes referred to herein as "optimum reaction rates" are dependent on a number of independent parameters including adsorbent density, the mass diffusion path length, the heat or thermal diffusion path length, as well as the thermodynamic operating conditions. The latter include the overall process conditions i.e., the specific temperature and pressure conditions in which the process is carried out, the differential pressure or $\Delta P$, i.e., the difference between the operating or system pressure and the equilibrium pressure of the complex compound, and the approach temperature or $\Delta T$, which is typically greater than 8° K. for the first adsorption reaction. Finally, the parameter of the specific salt and the complex compounds formed between the salt and a specific selected polar gas must be considered, it being understood that the characteristics of such salts and the resulting complex compounds, including the equilibrium pressures thereof, are important determinations in balancing the aforesaid parameters to optimize reaction conditions and achieve a system having maximized reaction rates. As sometimes used herein, the term "optimized reaction product" or "optimized complex compound" is a complex compound in which the polar gas sorption process on the metal salt is carried out under process conditions resulting in a complex compound reaction product having the aforesaid characteristics leading to an economic optimum.

Each reaction chamber or reactor module has dimensions which provide basis for measuring or determining the thermal diffusion path length (heat transfer) and the mass diffusion path length (mass transfer), respectively. The thermal path length is the distance from a highly thermally conductive surface to the center of the mass of complex compound. A heat conductive fin is an example of such a thermally conductive surface. In this example thermal diffusion in a given reactor is primarily a function of the fin count, i.e., the number of fins per unit of length (height) of the reactor modules. The greater the number of fins per unit of reactor length, the better the thermal diffusion and the less the thermal diffusion path length. The thermal diffusion path is the path from the most distant particle of complex compound to the nearest heat conductive surface. Thus, the simplified thermal path length is one-half the distance between two adjacent fins or plates. According to the invention, the thermal diffusion path length is less than 4.5 mm, preferably about 4 mm or less, and more preferably about 3.0 mm or less. Utilizing a group of preferred salts disclosed herein the most preferred thermal path length is between 0.6 and 3.2 mm. This is also equivalent of a fin count of at least 4 fins per inch, and preferably from about 9 to 25 fins per inch (1.4 mm to 0.5 mm thermal path length), or higher if practical for manufacture, for optimized power density requirements. The preferred thermal path length ranges for some specific salts are disclosed in aforesaid application Ser. No. 104,427 and are incorporated herein by reference. It will be understood that such a simplified path length determination does not take into consideration the tube wall, although that surface is also a contributor to the thermal path. Typical suitable and practical fin thickness will vary from about 0.07 mm to about 2 mm. Where thermal diffusion path lengths are relatively short, less fin thickness is usually preferred. The fin thickness is typically set to give a small temperature drop or rise in the fin as compared to desorption or adsorption approach temperature. The determination or measurement of the thermal path length can be readily determined for any three dimensional reaction chamber.

The size and shape of the fins or heat exchanger or thermal conducting surfaces is based on common heat transfer calculations understood by those skilled in the art. For example, the reactor may incorporate a plurality of heat exchange surfaces, fins or plates extending vertically radially along a heat exchange fluid conduit. Reactors of this type are illustrated in the aforesaid U.S. Pat. No. 5,298,231 and application Ser. No. 104,427. In this example, the distance between the fins or plates varies because of the wedge-like shape of the different reaction chambers between adjacent plates which are not parallel. However, the average distance between two adjacent plates will be measured at a point halfway between the inner and outer edges of the respective plates. In reactors of a design in which fin height is quite low or small, or in which the fin count is low, the proximity of a salt or complex compound molecule to a prime heat transfer surface such as tubes or plates also becomes important in determining the thermal path length. Measurement and determination of the thermal path length may be made regardless of the shape or size of the adjacent solid fin or reaction chamber wall surfaces extending from and in thermal communication with the heat exchange conduit or conduits extending through the reactor. Such heat exchange surfaces, walls, plates or fins also usually comprise the gas impermeable reactor module walls which define or form the reaction chamber or chambers within the reactor.

The reactor core may also comprise a tube fin reactor utilizing multiple tubes for directing heat transfer fluids through the reactor in thermal contact with the adsorption layer confined between the plates or fins and a gas permeable wall. This and other reactor examples are shown and described in the aforesaid application Ser. No. 104,427.

Although thermal diffusion path length is a highly important parameter, as set forth above the mass diffusion path length, i.e., the path length of a refrigerant molecule to and from an adsorption particle or molecule, is also quite critical in reactors or reaction chambers in which the density of the reaction product mass has been controlled by limiting the volumetric expansion, according to the present invention. In order to achieve the high reaction rates according to the present invention a reactor or reaction apparatus must be designed for the capability of moving a substantial amount of refrigerant within the adsorbent mass in a relatively short period of time. For this reason, the mass diffusion path length of the reactor is of utmost importance. The mass diffusion path length is determined by measuring the distance between the point or surface of entry of the gas into the adsorbent mass (reaction chamber or module) to the opposite end or wall of the chamber, which represents the greatest distance the gas must travel to and from molecules or particles of complex compound during adsorption and desorption cycles. This dimension is readily determined for any reaction chamber size or shape. However, the important consideration in determining the desirable, preferred or optimized mass diffusion path lengths must take into account the entire mass of adsorbent particles relative to gas distribution means, i.e., port, vent, etc., from which the gas is directed into and from the adsorbent mass within the reaction chamber. It is also to be understood that the flow of refrigerant through the sorbent mass, to and from the adsorption sites, is not simply based on gas permeability or penetration through a porous medium, nor is it based only on gas penetration through a dense product mass contained in a limited volume. Instead, in the present chemisorption reaction process, the complex compound adsorbent changes its properties throughout the process as it coordinates and adsorbs the gas molecules. Since the coordination is typically a polar gas adsorbed on the complex compound in one or more coordination spheres, sorption rates are impacted by both the coordination site coverage and by the shielding resulting from accumulation of coordinated polar gas molecules facing incoming polar gas molecules during adsorption. Accordingly, the mass flow path length or mean mass diffusion path becomes extremely important and critical to achieving high reaction rates and power density according to the invention. Thus, in any reactor, not only is a maximum mass transfer distance to an adsorbent particle to be considered, but also the average or mean distance the gas must travel to and from all particles of the mass. As used herein, the term mean mass diffusion path length or distance is defined as the arithmetic mean over all particles of the shortest distance from every particle to a gas permeable surface bordering the compound, gas distribution inlet, outlet or other gas distribution means. Thus, the mean mass diffusion path length=

$$\frac{\sum_{i=1}^{n} d_i}{n}$$

where $d_i$=shortest distance from $i^{th}$ particle to a gas permeable surface and n=number of particles.

According to the invention, for rapid adsorption and desorption reactions sorbing a substantial amount of the theoretically available refrigerant coordination sphere in less than about 30 minutes and preferably less than 20 minutes, for at least the adsorption cycle (discharge phase), the mean mass diffusion path length is less than 15 mm, and preferably about 13 mm or less and more preferably less than 8 mm. In order to meet this critical requirement, the reactor or reaction chamber or chambers of the apparatus in which the adsorbent is present and the gas distribution components, i.e., tubes, reactor walls, channels, inlets, ports, vents etc., are preferably designed so that the mean mass diffusion path as defined above, in such a reactor is 15 mm or less. For the group of preferred salts disclosed herein, the most preferred mean mass diffusion path length is between 3 and 7 mm. It is also preferred in the reactors or reaction chambers that at least 60% of the metal salt or the complex compound, by weight, is within 25 millimeters or less of a gas distribution means. The specific preferred mean mass diffusion path length ranges for some specific salts are disclosed in application Ser. No. 104,427 and are incorporated herein by reference.

From the above, it will be evident that both the thermal and mass diffusion path lengths may be changed or varied by selecting or designing a reactor having reaction chambers (modules) of desirable fin depth and reaction chamber height dimensions. An increase of the fin count, or number of fins per unit length of the reactor, will increase the system thermal conductivity and reduce the thermal path length. Likewise, the mass diffusion path length may be selected by selecting or designing a reactor having a greater or smaller distance between the gas permeable means through which the gaseous reactant passes during the alternate adsorption and desorption reaction phases, and the opposite end of the reaction chamber. For example, additional slots, gas tubing or gas permeable materials such as fire brick, porous cement, porous plastics, sintered metals or ceramics, wire mesh, etc., may be used in reactor assembly design for increasing gas inlet and outlet exposure for reducing mass diffusion path lengths. In designing or selecting reactors and reaction chamber configurations, these two independent parameters may be considered and selected to give a reactor having the reaction chambers of the desired heat diffusion and mass diffusion path lengths giving optimum or preferred reaction rates. Accordingly, optimum reactors capable of achieving desired reaction rates and power density according to the invention will have both thermal (heat) and mass diffusion path lengths as set forth above.

In designing reactor cores for optimizing the reactor module or reaction chamber dimensions pursuant to the invention, although relatively short gas diffusion paths are desirable from a reaction rate standpoint, the weight ratio of heat exchanger hardware to adsorbent may become prohibitive. In order to balance these features, the following principals may be applied. The heat transfer surface extension may be made of a thermally conductive and gas permeable material having less gas flow resistance than is encountered in the complex compound. For such an advantage the reactor core fin plates themselves may be designed to conduct gas through the fin or plate surface directly to the layer of adsorbent on each side of or otherwise in contact with the fin plate. Examples of suitable fin plate material include sintered and powdered sintered metals, metal foams, or highly conductive non-metal ceramics or other porous materials. Utilizing such fin plates for both heat transfer and gas distribution, the mass transfer distance described above would no longer apply, since the distance between adjacent fins or plates would become both the heat and mass transfer path distance to be considered. Secondly, where the use of gas permeable reactor fin plates for both heat and mass transport is not desirable, gas permeable components or materials spaced between reactor fin plates may be used. Such gas permeable materials which are compatible with the solid reactant and gaseous refrigerant offer low gas resistance, and substantially enhance and contribute to increased gas distribution throughout the solid adsorbent.

A third means for increasing gas diffusion through the complex compound is by using a gas permeable or porous material added to the salt, with the mixture then being introduced into the reactor core. Of particular interest are materials which may be mixed with the adsorbent salt and which have geometries that offer a directional flow for gas through the salt and complex compound mass. Such materials are referred to herein as gas directional flow admixture components or gas distribution admixture compositions. These materials may be used to enhance the overall gas or refrigerant transport to and from the sorption sites of complex compounds or mixtures which contain complex compounds and comprise components having elongated or extended microporous surfaces such as micro-tubes or other suitable geometries of materials that are gas permeable and have a gas transport resistance lower than the complex compound adsorbent during adsorption and/or desorption. Further description and explanation of such materials are disclosed in application Ser. No. 104,427 and are incorporated herein by reference.

Another parameter to be determined is the mass of salt per unit volume of reaction chamber cavity, or loading density of the solid particulate metal salt introduced into the reactor and the optimum density of the resulting complex compound reaction product to achieve the optimum or desired reaction rates or power densities for adsorbing and desorbing the gaseous reactant to and from the complex compound. In order to achieve the desired or optimum density of the complex compound in a reactor having a fixed volume, the amount or volume of unreacted salt introduced into the reaction chambers must be sufficient so that when the complex compound reaction mass structure is produced during the sorption process reaction, the volumetric expansion results in each reaction chamber or module being filled with the newly formed complex compound structure composition having the desired density. Normally, the density of the complex compound formed will be lower than the density of the salt before the initial reaction, although the density of a fully adsorbed complex compound is often higher. The density of the complex compound, will also vary depending on the operating conditions, i.e., pressure and temperature. Each salt and complex compound will react somewhat differently at different temperatures and pressures. Thus, such operating conditions, as well as the equilibrium pressure of the complex compound and the approach pressure, must be considered. Accordingly, the optimized density for each complex compound under such operating conditions must also be independently determined. According to the invention, the loading density of the adsorbent salts for reacting with ammonia in the heat exchanger cavity is preferably between about 0.2 and 1.0 g/cc, and more preferably between about 0.3 and 0.8 g/cc but for salts having a high bulk or pour density, the loading density may exceed 1 g/cc in particular for adsorbents of relatively high molecular weight. However, according to the invention, these density ranges must also take into account the above disclosed heat and mass transfer parameters. Thus, the selection of a salt density within the aforesaid limits is to be used in a reactor or reaction chamber having a thermal diffusion path length, and/or a mass diffusion path length as set forth and described hereinabove. Preferred loading density ranges for certain specific salts used with ammonia refrigerants are shown in Table I of the aforesaid application Ser. No. 104,427 and which information is incorporated herein by reference.

The density, mass diffusion path length and thermal path length of the ammoniated complex compounds of the most preferred $CaBr_2$, $SrBr_2$, $CoCl_2$, $FeCl_2$ and $FeBr_2$ salts are given below. The numerical values of density are for the complex compounds throughout the range of $NH_3$ coordination steps. The pressures given are those typically used or encountered by a system evaporator, or the pressure of a desorbing reactor to another system reactor or to a condenser or other adsorbing reactor. The density values are shown in grams/cc, and the mean mass diffusion path length and thermal path length values are in millimeters. The actual gas uptake may be less than the coordination step if salt loading densities exceed values which lead to insufficient volume for complete gas uptake.

TABLE II

| Complex Compound | Pressure (psia) | | Most Preferred Range | Preferred Range |
|---|---|---|---|---|
| $FeBr_2$ and | above 40 | density | 0.5 to 0.8 | 0.4 to 0.8 |
| $CaBr_2 \cdot$ | | mass | 3 to 6 | 2 to 8 |
| 2–6 ($NH_3$) | | thermal | 0.6 to 3 | 0.5 to 4 |
| $FeBr_2$ and | below 40 | density | 0.5 to 0.8 | 0.4 to 0.8 |
| $CaBr_2 \cdot$ | | mass | 3 to 6 | 2 to 8 |
| 2–6 ($NH_3$) | | thermal | 0.6 to 3 | 0.5 to 4 |
| $FeBr_2$ and | below 10 | density | 0.4 to 0.7 | 0.3 to 0.7 |
| $CaBr_2 \cdot$ | | mass | 3 to 6 | 2 to 8 |
| 2–6 ($NH_3$) | | thermal | 0.6 to 3 | 0.5 to 4 |
| $SrBr_2 \cdot$ | between | density | 0.5 to 0.9 | 0.4 to 1.1 |
| 2–8 ($NH_3$) | 25 and | mass | 3 to 6 | 2 to 8 |
| | 40 | thermal | 0.6 to 3 | 0.5 to 4 |
| $SrBr_2 \cdot$ | below 25 | density | 0.4 to 0.9 | 0.4 to 1.1 |
| 2–8 ($NH_3$) | | mass | 2.5 to 6 | 2 to 8 |
| | | thermal | 0.6 to 3 | 0.5 to 4 |
| $CoCl_2 \cdot$ | above 40 | density | 0.4 to 0.8 | 0.3 to 0.8 |
| 2–6 ($NH_3$) | | mass | 3 to 6 | 2 to 8 |
| | | thermal | 0.6 to 3 | 0.5 to 4 |
| $CoCl_2 \cdot$ | below 40 | density | 0.3 to 0.8 | 0.2 to 0.8 |
| 2–6 ($NH_3$) | | mass | 3 to 6 | 2 to 8 |
| | | thermal | 0.6 to 3 | 0.5 to 4 |
| $CoCl_2 \cdot$ | below 15 | density | 0.2 to 0.7 | 0.15 to 0.7 |
| 2–6 ($NH_3$) | | mass | 2.5 to 6 | 2 to 8 |
| | | thermal | 0.6 to 3 | 0.5 to 4 |
| $FeCl_2 \cdot$ | above 40 | density | 0.4 to 0.8 | 0.3 to 0.9 |
| 2–6 ($NH_3$) | | mass | 3 to 6 | 2 to 8 |
| | | thermal | 0.6 to 3 | 0.5 to 4 |
| $FeCl_2 \cdot$ | below 40 | density | 0.3 to 0.8 | 0.2 to 0.8 |
| 2–6 ($NH_3$) | | mass | 3 to 6 | 2 to 8 |
| | | thermal | 0.6 to 3 | 0.5 to 3 |

Specific improvements in the reaction rates by optimizing the heat diffusion and mass diffusion path lengths and the complex compound density result in substantial improvements and increase in the reactor economics. This improvement substantially impacts on the efficiency of the complex compounds and concomitantly, the amount of energy which can be provided by the system or apparatus in a given reaction cycle period. For example, in some equipment applications reaction rates of approximately 10–15 moles/mol-hr. imply half-cycle periods of about ten to twelve minutes, i.e., a ten minute time required for adsorbing or desorbing the desired amount of gaseous ligand from the complex compound. By comparison, reaction rates of 25 to 35 moles/mol-hr. imply half-cycle periods of about five to seven minutes, thereby approximately doubling the energy available from such a system for a given time period of operation. The high reaction rates obtained by using the optimized reactors as previously described are capable of being sustained not only for short cycle periods, but over periods of up to 20 minutes, or more. Thus, reaction rates of above 6 moles/mol-hr, typically 10–20 moles/mol-hr may be sustained for at least 6 minutes, typically up to 12–15 minutes and for some reactions up to 20–30 minutes. The aforesaid reaction rate figures are averages, based on the average of the reaction rates up to the time when the reaction is complete or otherwise terminated.

Reactors of the invention, in which the volumetric expansion of the complex compounds is restricted during the sorption process reactions are capable of taking up, i.e., adsorbing and desorbing, at least 0.02 grams (20 milligrams) of $NH_3$ per minute and per cc of adsorbent where reaction times are 30 minutes or less. Moreover, where the reaction times are limited to 30 minutes or less, such reactors are capable of taking up 0.01 grams (10 milligrams) of $NH_3$ per minute per cc of total reactor enclosure volume, i.e., within the total volume of the pressurized reactor enclosure, such process may be limited by possible early completion of the sorption if saturation is obtained in less than 30 minutes. Reaction rates are typically dependent upon the degree of reaction completion. Equations of the form $$\Delta N = \Delta N_{max} (1 - e^{-kt})$$

where:

| | | |
|---|---|---|
| $\Delta N$ | = | reaction extent (moles/mole) |
| $\Delta N_{max}$ | = | maximum reaction extent (moles/mole) |
| $t$ | = | time (sec) |
| $k$ | = | reaction kinetics value (sec$^{-1}$) |

($k$ is called herein reaction constant)

can be used to describe reaction progress over time. The above equation is put in a terminology and units useful for complex-compound sorption reactions of the present invention. The reaction constant k describes the time dependency of reaction progress for any time. Reaction rates can be obtained from an expression involving k and time:

$$\text{rate (mole/mole - hr)} = \frac{\Delta N}{(t \times 3600)} = \Delta N_{max} \frac{(1 - e^{-kt})}{(t \times 3600)}$$

with units again convenient for the sorption reactions as described herein. As an example of using these equations, $SrCl_2 \cdot NH_3$ can complex up to 7 moles of ammonia in the 1 to 8 step, so $\Delta N_{max}$ is 7. For a time of 6 minutes (360 seconds) and k value of 0.004 sec$^{-1}$, $\Delta N$ is 5.3 moles of ammonia per mole of salt. Reaction progression this far in 6 minutes requires an average rate over this 6-minute period of 53 moles/mole-hr. A reaction constant of 0.0004 gives $\Delta N$ of 0.94 in 6 minutes, or an average reaction rate of 9.4 moles/mole-hr. Given a reaction constant (k) for any sorber configuration with any salt, the extent of reaction completion and reaction rates at any time are readily determined. The actual amount of refrigerant adsorbed and rates do depend on the size of the sorption step, $\Delta N_{max}$. Sorption rates achievable by the present invention lead to the following minimum values for the reaction constant:

| $\Delta N_{max}$ | k |
|---|---|
| up to 4.5 moles/mole | 0.0004 |
| between 4.5 and 6 moles/mole | 0.0003 |
| above 6 moles/mole | 0.0002 |

Such reaction determinations are useful for adsorption and/or desorption periods of less than about 30 minutes.

The reactivity of the salts may be further enhanced by initially adsorbing a small amount of a gaseous ligand on the salt, which additive ligand is different from the gaseous reactant to be used in the complex compound. Any of the aforesaid polar gaseous reactants may be used, and particularly preferred are water, ammonia, lower molecular weight aliphatic alcohols, amines, or phosphine. The amount of the additive material is preferably between about 0.05% and about 10% by weight of the salt. The use of a hydrated salt containing a small but effective amount of water adsorbed on the salt may be satisfactory for such a purpose.

The apparatus of FIGS. 1 and 2 is designed to be operated on a selective intermittent basis, sometimes referred to as "batch" operation. For such operation, the apparatus is charged by desorbing the polar refrigerant from the complex compound in the reactor or reactors, and condensing and accumulating the condensed refrigerant gas in the condenser or reservoir, or in the evaporator until the appliance is to be used for a cooling or freezing operation. The charged, desorbed sorber is preferably cooled to ambient or near ambient temperatures to approach equilibrium of the complex compound prior to initiating the freezing operation. In the batch operation, because rapid freezing is achieved only during adsorption, a rapid adsorption rate is relatively critical, as compared to desorption rates. However, increased desorption rates are also desirable for achieving faster regeneration times.

In FIG. 1, a back or side panel 28 of the cabinet of a rapid cooling or freezing appliance 12 is shown, on which is installed or positioned a reactor 14, condenser 16 and reservoir 21. Conduit 18 directs desorbed polar gas from reactor 14 to condenser 16. A check valve 13, or other valve which may be selectively operated, i.e., manually or by solenoid, is provided in conduit 18. In the preferred embodiment shown, the apparatus includes a reservoir 21 for receiving and accumulating condensed refrigerant from condenser 16 via conduit 22. The reservoir is positioned below the condenser to provide gravitational feed of the condensed refrigerant. Fans 15 and 19 to assist in cooling of the condenser and reactor, respectively, are provided. Conduit 17 directs condensed refrigerant from the reservoir to the evaporator. If a reservoir is not used, the condensed refrigerant flows directly from the condenser to the evaporator. In FIG. 2, evaporator 20 is shown positioned within interior cooling chamber 26 with fan 24 circulating cooling chamber air in thermal contact with the heat transfer surface components of evaporator 20. A valve 25 for controlling the flow of refrigerant is provided between the reservoir 21 and evaporator 20. The valve may be an expansion valve, i.e., a thermostatic expansion valve, or a solenoid operated valve, or other valve suitable for controlling refrigerant flow to the evaporator. Refrigerant gas is directed from evaporator 20 through one-way valve 27 via conduit 29 to reactor 14 for adsorption. If a liquid overfeed or flood-type evaporator is used, the apparatus is operated by directing a charge of refrigerant to the evaporator prior to starting a freezing cycle and a selectively operated shut-off valve 23 is used along conduit 29 between the evaporator and reactor to selectively start and stop a freezing cycle.

Although a single evaporator and condenser are shown, the apparatus may also be designed to incorporate two or more evaporators and/or two or more condensers, especially where a plurality of reactors or reactor banks are used, as will be further described hereinafter. Alternatively, the apparatus may incorporate evaporator and condenser means comprising a single heat exchanger which alternates between evaporator and condenser functions, such as described in U.S. Pat. No. 5,186,020 and incorporated herein by reference. However, such an embodiment is usually only practical in a batch or intermittent operating apparatus where the sorbers are directly cooled, i.e., air cooled, and such that the condenser function is not used or needed to reject sorber heat.

In operation, to charge the apparatus of the embodiment of FIGS. 1 and 2, valve 13 is opened and the complex compound in reactor 14 is heated causing desorption of ammonia or other polar gas refrigerant adsorbed on the complex compound. The desorbed refrigerant is directed to condenser 16 via conduit 18. The refrigerant condensate is then accumulated and held in the condenser or the reservoir until the appliance is to be used for rapid cooling or freezing. Where a liquid overfeed or flood-type evaporator is used, condensed refrigerant flows to and is accumulated in the evaporator. Performance is improved if the reactor is cooled prior to initiation of the cooling or freezing cycle. Thus, prior to initiating the cooling/freezing operation, it is preferred to "equilibrate" the apparatus by allowing the reactor to cool to ambient, or near ambient, temperatures. This is accomplished by closing valve 25 while fan 19 is operated to assist in cooling the reactor. Equilibration times may be from about 30 seconds to a few minutes or so, depending on the complex compound used, reactor temperature during desorption, etc. Such cooling of the sorber is highly advantageous and significantly improves the adsorption efficiency, i.e., adsorption rate, of the complex compound (salt) sorbent for the gaseous refrigerant.

The rapid freezing operation of the charged (desorbed) apparatus is selectively initiated by energizing the fans and opening valve 25. A switch 11 or other activation means may be provided for initiating the selective rapid cooling or freezing operation whereby valve 25 is opened, fans 19 and 24 are energized and the condensed refrigerant is directed via the valve 25 through evaporator 20 and returned to reactor 14 where it is adsorbed. This operation may be continued until all of the accumulated refrigerant condensate has been evaporated and adsorbed in reactor 14, or the operation may be interrupted by closing valve 25 or otherwise terminating the flow of refrigerant to and from evaporator 20. Various means such as one or more valves or gates together with controls may be used in cooperation with conduits 17 and valve 25 for initiating as well as interrupting the flow of refrigerant between the reservoir and the evaporator and from the evaporator to the reactor as previously described. The apparatus will also typically include switching means including switch 11 operatively connected to controls for initiating the charging phase by heating the complex compound in reactor 14 as previously described. For example, a plurality of switches or controls may be provided, one for initiating the charging phase, the other for initiating the rapid cooling or freezing operation (discharge phase). Other components such as a thermostat for automatically controlling the temperature within cooling chamber 26 may be used which cooperates with suitable means such as valves or gates for metering or regulating the flow of refrigerant condensate from the condenser to the evaporator required to maintain the desired temperature in the cooling chamber. To accomplish defrosting of the evaporator, or partial defrosting of frozen goods, foods or products in the cooling chamber, hot desorbing polar gas may be directed through the evaporator, or electrical resistance heating elements may be provided. These and other equivalent defrost components will be understood by those skilled in the refrigeration art.

Although a single reactor 14 is shown in FIG. 1, a plurality of such reactors or plurality of reactor banks may be used with each of the reactors or banks acting simultaneously or sequentially for adsorbing polar gas from the evaporator during the cooling or freezing operation, and desorbing the gaseous refrigerant during the charging phase. A suitable apparatus design using two reactors is shown in U.S. Pat. No. 5,161,369 and incorporated herein by reference. Suitable valves for directing the gas to the various plurality of reactors may also be used together with the required conduits. The one or more reactors is also supplied with heating means, for example, internal resistive heating elements which are energized for heating the complex compound and driving the desorption reaction during the charging phase. Other means for heating the complex compound to drive the desorption such as using heat from exterior heating means, burners, boilers, etc. as is disclosed in the aforesaid patents and applications and understood by those skilled in the art may be used instead. Gas burners, especially propane, butane or natural gas burners, may be particularly practical for use in household appliances described herein.

Multiple reactor apparatus may utilize reactors containing the same complex compound and operating as described above, or a plurality of reactors may be used in which the reactors contain different complex compounds. Such an embodiment provides for using a higher pressure, highly efficient complex compound sorbent in one reactor for rapid initial evaporator temperature pull down followed by using one or more lower pressure complex compound sorbents in one or more other reactors, respectively, to achieve final desired evaporator temperature. Such multiple reactor or reactor bank systems may be operated by time sequencing or by overlapping sorption cycles of the different reactors or even using parallel reaction cycles as the individual reaction rates of the different complex compounds, if properly selected, lead to a desired apparatus cool-down profile. This embodiment may be quite beneficial where the initial temperature of the hardware, including the evaporator and other appliance cooling components are at or near ambient, i.e., typical room temperatures of between about 20° C. and about 35° C. Thus, an apparatus of this embodiment may use, for example, a two reactor system each with a different complex compound, or a three or more reactor system using three or more different complex compounds, each having a different vapor pressure. Although more than three reactor, banks with three compound systems are also contemplated, such systems may be somewhat impractical. Preferred higher pressure complex compounds are those formed between ammonia and $CaCl_2$, $CaBr_2$, $SrCl_2$, $SrBr_2$, $MgCl_2$, $MgBr_2$, $MnCl_2$ or $MnBr_2$. Preferred lower pressure complex compounds are those of ammonia and $CaBr_2$, $Sr_2Br_2$, $CoCl_2$, $CoBr_2$, $FeCl_2$, $FeBr_2$, $MgCl_2$, $MgBr_2$, $MnCl_2$, or $MnBr_2$. Examples of different combinations of complex compounds that may be useful for such an embodiment include (a) $SrCl_2.1$–$8$ $(NH_3)$/$SrBr_2.2$–$8$ $(NH_3)$, (b) $SrBr_2.2$–$8$ $(NH_3)$/$CaBr_2.2$–$6$ $(NH_3)$, (c) $SrBr_2.2$–$8$ $(NH_3)$/$CoCl_2.2$–$6$ $(NH_3)$, (d) $SrCl_2.1$–$8$ $(NH_3)$/$SrBr_2.2$–$8$ $(NH_3)$/$CaBr_2.2$–$6$ $(NH_3)$. In these examples, the first complex compound is the higher pressure compound to be used in a first reactor or reactor bank for initial adsorption, followed by sequential, overlapping or parallel adsorption of second (and third) compounds in their respective reactors or reactor banks. Adsorption in the first reactor is usually very rapid, thus requiring a compound having a high adsorption rate efficiency as disclosed above. In operating a system of this embodiment, first reactor adsorption has at least made substantial progress or is substantially completed and second (and subsequent reactor adsorption) is usually initiated prior to reaching the final or minimum desired evaporator temperature. Thus, the first complex compound could adsorb to achieve evaporator temperature cool down, for example, from ambient to −10° C. and thereafter refrigerant adsorption in the second reactor at least dominates to cool the evaporator to about −30° C. or other desired low end temperature. Other complex compounds and combinations may be chosen based on the temperature ranges disclosed in U.S. Pat. No. Re. 34,259, the description of which is incorporated by reference. In a two reactor or reactor bank apparatus of this embodiment, operation or operating time (adsorption) may be divided between the reactors depending on the selection of salts, desired operating temperature, etc., with initial, high pressure compound adsorption usually operated for less than 50% of the total adsorption process or operating time required to complete the desired final product freezing/cooling process, although 50% or higher initial reactor operating process or time may be used. Such an apparatus will include necessary controls, timers, heaters, valves, etc. for controlling and achieving desired apparatus cooling operation and function, including progressively cooling the evaporator and product by providing sequential adsorption in the different reactors if the sequential mode is selected.

In another embodiment, the apparatus may comprise one or more pairs of reactors operated to provide rapid cooling or freezing over an extended time and/or continuous cooling or freezing. Such an apparatus may be configured substantially as shown in our aforesaid U.S. Pat. No. 5,161,369 and operated as described therein, the descriptions of which are incorporated herein by reference. Such apparatus may also contain a reservoir for accumulating condensed refrigerant from the condenser, as described above. In such operation, one of the reactors or reactor banks of a pair adsorbs refrigerant vapor from the evaporator while the other reactor or reactor bank of the pair is being charged by desorbing the refrigerant to the condenser. Thus, each reactor operates substantially as the single reactor system described above, with the respective reactors each concurrently operating on a different alternating adsorption and desorption half-cycle, i.e., out of phase.

Other equivalent devices may be substituted for the expansion valve previously described, examples of which are illustrated in FIGS. 5 and 6. Both of these devices utilize float controls in a float chamber for actuating or operating a valve for feeding liquid refrigerant to the evaporator assembly. In FIG. 5, a float system device includes a float chamber 55 in which a float 52 moves as it floats on the surface of the liquid refrigerant present in the float chamber. The float comprises any suitable light-weight material which is inert to the refrigerant. Where ammonia is the refrigerant, having a specific gravity as low as 0.55, examples of suitable float materials include polypropylene and nylon. Embedded or attached to the float 52 is a magnet 54 which is sensed by sensor 56 for operating solenoid valve 58. The solenoid valve includes a small orifice between the liquid refrigerant feed conduit 17 and float chamber 55. The solenoid valve 58 opens and closes the small orifice. When the liquid refrigerant level in the float chamber drops, as the float moves past the sensor, the solenoid valve is activated and the valve opens to allow the flow of liquid refrigerant into the chamber. The float chamber 55 also serves as a liquid-vapor separator to prevent liquid ammonia from entering the suction line or conduit 29 which leads to check valves in the conduit lines between the evaporator and the reactor, for example, as illustrated in FIG. 2.

FIG. 6 illustrates another type of float control device used in evaporator assembly 60 which may be referred to as a "whisker" valve and float apparatus. In this device, one end of an elongated wire or "whisker" 64 is attached to a plug 65 which is biased or forced against valve seat 62 utilizing a spring 67. A float 68 is positioned in float chamber 66, so that when the liquid level in the float chamber is low, the float contacts the end of whisker 64 opposite the valve seat. Movement of the whisker is caused when the refrigerant level in float chamber is low enough so that float 68 rests against the end of whisker 64 opposite the valve seat causing the plug 65 to become offset or tilted relative to valve seat 62 thereby allowing liquid refrigerant to enter the float chamber from conduit 17. The float may also be mechanically or physically linked or secured to the whisker whereby the whisker could be located above the float. Other physical modifications of the components illustrated may be used for achieving the same purpose and function. An advantage of utilizing the float control illustrated in FIG. 6 is the elimination of level sensors and solenoid valves and may be preferred in small cooling/refrigerating appliances. Either of the float control valve and evaporator components shown in FIGS. 5 and 6 may be used in the apparatus illustrated in FIGS. 1 and 2.

The important feature of the above-described apparatus, whether a single or multiple reactor apparatus designed for intermittent operation, or paired reactors designed for continuous cooling/freezing, is in using reactors containing the complex compound, or mixtures of complex compounds, having the capability of increased reaction rates as previously described. It is possible to carry out such reactions at an average reaction rate of above 6 moles/mol-hr for at least 6 minutes, if desired. Such complex compounds, in a desorbed condition, are capable of adsorbing at least 50% of their polar gas holding capacity at the adsorption rates of greater than 15 moles of ammonia gas per mole hour of the complex compound at operation times of less than 30 minutes and preferably between about 3 and about 20 minutes. Where maximum cooling or freezing capacity is desired, reaction rates of 20 moles per mole hour, or greater, in the aforesaid times are desirable. Because of such high reaction rates, the apparatus of the invention is capable of freezing most foods or compositions being at ambient temperatures below about 80° F. (27° C.), within about twenty minutes, or less, depending on the consistency and density of the material to be frozen. However, regardless of the size of the sample and composition, and the initial sample temperature, freezing times will be substantially less as compared to conventional freezers. The foods or other goods, materials or compositions to be rapidly cooled and/or frozen using the apparatus of the invention may be referred to as part of the "cooling load", which includes, in addition to such goods, the evaporator, cooling chamber walls, and air in the chamber.

The above-described rapid-freeze apparatus, whether single or multiple reactor design may also be used for extended cooling/freezing operation. Thus, once the food, etc. placed in the cooling chamber is rapidly frozen or cooled it may be maintained at desired frozen or cooled temperature by continued operation of the apparatus. Suitable thermostatic monitor and control components for such operation may be installed, including components for automatically switching to continued operation (continuous or intermittent) required to maintain the goods at a desired temperature once a selected temperature of the contents has been reached. Such continued operation may be provided for and achieved in a single reactor (sorber) apparatus or using multiple reactors operating in phase, or multiple reactors operating out of phase, as previously described.

FIGS. 3 and 4 show another embodiment of the rapid cooling or freezing apparatus of the invention in which the evaporator in the previous embodiment has been replaced with a reactor assembly. More specifically, the apparatus or appliance illustrated in FIGS. 3 and 4 comprises one or more inside reactors, i.e., reactors that are located in the cooling chamber or in thermal or heat exchange contact with the cooling chamber, and one or more second reactors that are positioned away from the cooling chamber, typically on the outside of the cabinet or container of the appliance. Each of the first and second reactor assemblies include one or more individual reactors, preferably a plurality of reactors, typically comprising a plurality of elongated reactor cores or tubes which contain the complex compound. In FIG. 4, the first reactor assembly or first reactors 42 are positioned or located in the appliance with thermal exposure to the cooling chamber 46. The thermal exposure may be direct as shown, or indirect incorporating one or more suitable heat exchangers. In FIG. 3, the second reactors 32 are located substantially away from thermal exposure to the cooling chamber, as shown, for example, secured on the outside of the appliance in exposure to ambient air convection for cooling, which may also be assisted by using fans, etc. The external second reactors 32 are preferably designed to be efficiently cooled by ambient air. The second reactors also incorporate heating means for heating the complex compound for driving a desorption reaction. Resistive heating elements as previously disclosed may be used or heat may be generated by gas burners, etc. The first cooling reactors 52 may be of a similar construction, although need not incorporate heating means for the complex compound. The apparatus also includes a fan 45 or other air handling means for circulating the air in the cooling chamber over the cooling reactor surfaces, and conduit 35 and valve 34 for directing the polar gas refrigerant between the first and second reactors. Manifolds 33 and 37 are provided for directing and distributing the polar gas to and from the reactors. Switch 41 for selectively actuating or starting the apparatus preferably includes controls, timers, etc. for energizing heaters for second reactors 32, for opening and closing valve 34 and energizing fan 45, all in proper sequence for selectively starting and terminating operation of the appliance.

In this embodiment, it is important that the complex compound in the respective first and second reactors have an equilibrium temperature differential. The term "equilibrium temperature differential" is intended to mean the difference between any two different complex compound equilibrium temperatures at the same or substantially the same operating pressure, typically between about 0.1 and about 35 bars in the apparatus of the invention. Such an equilibrium temperature differential will provide sufficient practical temperature lift and yet be within practical and safe ranges for heat rejection during exothermic refrigerant adsorption. The complex compounds selected for the first, cooling reactors are the ammonia complexes of $BaCl_2$, $CaCl_2$ and $SrCl_2$, which may be referred to as high pressure, low temperature complex compound. The specific complex compounds comprise $BaCl_2.0-8$ $(NH_3)$, $CaCl_2.4-8$ $(NH_3)$, $CaCl_2.2-4$ $(NH_3)$, or $SrCl_2.1-8$ $(NH_3)$. The preferred complex compounds in the second reactors comprise $LiCl.0-3$ $(NH_3)$, $SrBr_2.2-8$ $(NH_3)$, $CaBr_2.2-6$ $(NH_3)$, $CaCl_2.0-1$ $(NH_3)$, $CaCl_2.1-2$ $(NH_3)$, $CaCl_2.2-4$ $(NH_3)$, $CoCl_2.2-6$ $(NH_3)$, $SrCl_2.1-8$ $(NH_3)$, $NiCl_2.2-6$ $(NH_3)$, $FeCl_2.2-6$ $(NH_3)$, $FeBr_2.2-6$ $(NH_3)$, $SnCl_2.0-2.5$ $(NH_3)$, or $NaBF_4.0.5-2.5$ $(NH_3)$.

To operate the apparatus of FIGS. 3 and 4, the system is charged by heating the complex compound in the high temperature, low pressure second reactors 32 to desorb the polar refrigerant which is directed to the first reactors 42 via conduit 35 and through valve 34, which has been selectively opened. During this charging phase the polar gas refrigerant is adsorbed on the complex compound in the first reactors which become heated by the exothermic adsorption reaction. Thus, the charging phase is preferably carried out during a time when the apparatus is not to be used for cooling. The apparatus design may include louvers or flap-valves cooperating with fan 45 for directing outside ambient air into and out of the chamber around the reactors for cooling the adsorbing reactors during the charging phase or directly to reactors for cooling reactors which are not installed for direct exposure in the cooling chamber. After charging is complete, valve 34 is closed and the system is allowed to cool to ambient or near ambient temperature conditions. To start cooling or freezing, valve 34 is opened, for example, either by manually actuating switch 41, or by command from a timing and/or control function of the switch. Because of the equilibrium pressure differences between the different complex compounds in the first and second reactors, the polar refrigerant is suctioned from the first reactors 42 as the complex compound therein is desorbed in an endothermic reaction to provide cooling in cooling chamber 46. The desorbed polar refrigerant is adsorbed in the second reactors 32 and heat generated by the adsorption reaction is rejected to ambient conditions outside of the cooling chamber. Again, the important aspect of this embodiment is the ability of the complex compounds to adsorb and desorb rapidly, whereby substantial cooling may be achieved in a relatively short period of time. Although complex compound reaction rates may be determined by the aforesaid equations, in this embodiment, desorption reaction rates of the sorbers in the cooling chamber are important. Moreover, such cooling reactors have a greater thermal mass as compared to an evaporator. Thus, to achieve equivalent performance, the complex compound in the cooling chamber in an adsorbed condition, should be capable of desorbing at least 50% of its polar gas at desorption rates of about 8–10 moles of ammonia per mole hour of complex compound in 30 minutes or less. Additional description of the preferred pairing of the complex compounds is disclosed in the aforesaid application Ser. No. 149,453, incorporated herein by reference. Again, a thermostat or other temperature control means may also be utilized regulating valve 34 to control the rate at which refrigerant is desorbed from first reactors 42, and thus the cooling temperature of the appliance. Although only one pair of first and second reactors are shown in the embodiment of FIGS. 3 and 4, such an apparatus may incorporate two or more pairs, each pair being operated in opposite or reverse cycles. Such an apparatus is also described in application Ser. No. 149,453 and is incorporated herein by reference.

The size of the cooling chamber in any of the above described appliances may be selected to accommodate any desired uses, such as household or leisure appliances, typically between about 2 and 40 liters, having cooling power of between about 50 and 1,500 watts, as well as scaled up for larger freezer systems, or scaled down for smaller devices, for example, for laboratory use, for rapidly cooling or freezing test tubes, or for small appliances such as ice-cube makers, iced tea makers, beverage coolers, such as used for rapidly cooling wine bottles, making frozen drinks, and the like. The evaporator used in any of the above-described apparatus embodiments may also be designed for contact cooling/freezing as an alternative to the typical evaporator designed primarily for convective cooling as shown in the drawings. Thus, the evaporator may be shaped for substantial contact with a container holding the composition or goods to be rapidly frozen, or otherwise for conforming to a shape suitable for making such direct contact with products or goods to be frozen. Such contact may also be enhanced by using somewhat flexible or formable metal or plastic evaporator coils which may be formed or molded to achieve increased contact with goods, products or containers. Alternatively, the appliance may be designed with the evaporator outside of the cooling chamber, in thermal, heat exchange contact with the cooling chamber interior. Other specific appliance designs and features understood by those skilled in the art may be used. The apparatus may also be a component of a combination appliance which may be used for both rapid cooling and/or freezing, as previously described, together with a microwave oven feature. Such an embodiment is described in U.S. Pat. No. 5,161,389, and is incorporated herein by reference. The apparatus may also be combined with a conventional refrigerator and/or freezer. For example, the apparatus of the present invention may be an attachment to but also possibly be incorporated as an integral part of a conventional, vapor compression or absorption refrigerator or freezer with the cooling chamber of the rapid cooling/freezing apparatus used as a subcompartment of the cooling or freezing compartment of the conventional appliance, i.e., similar to an ice maker assembly. An advantage of such an embodiment is that the cooling chamber of the apparatus of the invention and its cooling components, e.g. evaporator, walls etc., will be precooled by exposure to the cold compartment of the conventional appliance thus improving efficiency of the rapid cooling/freezing apparatus and even further reducing the time required to rapidly freeze the goods especially if the conventional freezer evaporator aids the quick freeze/quick cool by simultaneous operation. Such an appliance may incorporate dispensing means such as drawers, chutes, trays, etc., and controller and operating components for automatically discharging rapidly frozen goods from the rapid freeze subcompartment to the conventional freezer compartment. These as well as other uses and advantages of the apparatus described above are intended to be within the purview of the invention disclosed herein.

We claim:

1. An apparatus capable of providing rapid cooling and/or freezing comprising:

(a) a cabinet or container having a cooling chamber therein;

(b) one or more reactors each containing a complex compound formed by adsorbing a polar gas on a metal salt, and in which said polar gas is alternately adsorbed and desorbed on said complex compound, said metal salt comprising a halide, nitrate, nitrite, oxalate, perchlorate, sulfate or sulfite of an alkali metal, alkaline earth metal, transition metal, zinc, cadmium, tin or aluminum, or sodium borofluoride or a double metal chloride, or mixtures thereof, and wherein said complex compound in said one or more reactors is formed by restricting the volumetric expansion and controlling the density thereof during said adsorption of said polar gas on said metal salt, whereby said complex compound is capable of increased reaction rates in the number of moles of said polar gas adsorbed and/or desorbed per mole of said complex compound per hour at adsorption or desorption times of less than 60 minutes, respectively, as compared to a complex compound formed without restricting the volumetric expansion and controlling the density thereof, and wherein said complex compound in a desorbed condition is capable of adsorbing said polar gas at a rate sufficient to achieve rapid cooling or freezing in about 30 minutes or less;

(c) condenser means for condensing said polar gas and evaporator means thermally exposed to said cooling chamber for providing cooling therein, and conduits and one or more valves cooperating therewith for directing said polar gas from said one or more reactors to said condenser means, and from said evaporator means to said one or more reactors; and (d) heating means cooperating with said one or more reactors for heating said complex compound therein.

2. The apparatus of claim 1 including valve means and control means cooperating therewith for providing selective accumulation of desorbed condensed polar gas in said condenser, and for selectively directing said polar gas from said condenser to said evaporator and to said one or more reactors to provide said adsorption.

3. The apparatus of claim 1 wherein said complex compound in a desorbed condition is capable of adsorbing at least 50% of its gas holding capacity of said polar gas at a rate of at least 15 moles per mole hour of said complex compound in 30 minutes or less.

4. The apparatus of claim 1 wherein said complex compound is capable of adsorbing said polar gas at a rate of at least 20 moles per mole hour of said complex compound in between about 3 and about 20 minutes.

5. The apparatus of claim 1 wherein said polar gas is ammonia, and wherein said complex compound is capable of adsorbing and/or desorbing at least 0.02 grams of ammonia per cc per minute of adsorption or desorption cycle time, respectively.

6. The apparatus of claim 1 wherein said polar gas is ammonia and wherein said complex compound is capable of adsorbing and/or desorbing at least 0.01 grams of ammonia per minute per cc of total reaction chamber volume.

7. The apparatus of claim 1 including a reservoir for receiving and accumulating condensed polar gas from said condenser means, and conduits for directing condensed polar gas from said condenser means to said reservoir and from said reservoir to said evaporator means.

8. The apparatus of claim 7 including one or more valves cooperating with said conduits for selectively terminating the flow of condensed polar gas from said reservoir to said evaporator means.

9. The apparatus of claim 1 wherein one of said valves is for selectively terminating the flow of polar gas from said evaporator means to said one or more reactors.

10. The apparatus of claim 7 wherein one of said valves is for selectively terminating the flow of polar gas from said evaporator means to said one or more reactors.

11. The apparatus of claim 1 wherein one of said valves is for selectively terminating the flow of condensed polar gas from said condenser means to said evaporator means.

12. The apparatus of claim 8 comprising a single reactor.

13. The apparatus of claim 1 comprising a pair of said reactors for concurrently operating in opposite adsorption/desorption half-cycles, respectively.

14. The apparatus of claim 1 including a float control device cooperating with a conduit and said evaporator for feeding condensed polar gas to said evaporator.

15. The apparatus of claim 14 wherein said float control device comprises a float chamber having a float therein and a valve actuated by movement of said float for directing condensed polar gas to said evaporator in response to the position of said float in said float chamber.

16. The apparatus of claim 1 wherein said condenser means comprises one or more condensers and said evaporator means comprises one or more evaporators.

17. The apparatus of claim 1 wherein said condenser means and said evaporator means comprise a heat exchanger for alternately functioning as a condenser and an evaporator.

18. The apparatus of claim 1 comprising one or more first reactors containing a first complex compound and one or more second reactors containing a second complex compound different from said first complex compound, and wherein said first complex compound has a higher vapor pressure than said second complex compound.

19. The apparatus of claim 18 wherein said first complex compound comprises an ammoniated metal salt selected from the group consisting of $CaCl_2$, $CaBr_2$, $SrCl_2$, $SrBr_2$, $MgCl_2$, $MgBr_2$, $MnCl_2$ and $MnBr_2$.

20. The apparatus of claim 18 wherein said second complex compound comprises an ammoniated metal salt selected from the group consisting of $CaBr_2$, $SrBr_2$, $CoCl_2$, $CoBr_2$, $FeCl_2$, $FeBr_2$, $MgCl_2$, $MgBr_2$, $MnCl_2$ and $MnBr_2$.

21. The apparatus of claim 18 comprising one or more third reactors containing a third complex compound different from said first and said second complex compounds, and having a lower vapor pressure than said first and said second complex compounds.

22. A method of operating an apparatus of claim 18 comprising adsorbing said polar gas in said one or more first reactors for initially cooling a thermal load to a first temperature, and adsorbing said polar gas in said one or more second reactors for cooling said thermal load to a second temperature, lower than said first temperature.

23. A method of operating an apparatus of claim 21 comprising adsorbing said polar gas in said first, second and third reactors, respectively, for progressively cooling a thermal load.

24. A method of operating the apparatus of claim 1 comprising:

(a) heating said complex compound in said one or more reactors and desorbing polar gas therefrom to said condensing means; and (b) selectively directing said condensed polar gas to said evaporator means and evaporating said polar gas therein for cooling said cooling chamber, directing said polar gas from said evaporator means to said one or more reactors and adsorbing said polar gas on said complex compound therein at a rate sufficient to achieve rapid cooling or freezing in 30 minutes or less.

25. A method of claim 24 including directing and accumulating condensed polar refrigerant in said evaporator means and actuating a shut-off valve terminating the flow of refrigerant from said evaporator to said one or more reactors, allowing said one or more reactors to cool, and selectively opening said shut-off valve to initiate a cooling operation.

26. The method of claim 24 wherein said adsorption is carried out on a desorbed complex compound wherein at least 50% of the gas holding capacity of said complex compound is adsorbed thereon at a rate of at least 15 moles per mole hour in 30 minutes or less.

27. The method of claim 24 wherein the rate of adsorption of said polar gas on said complex compound is greater than 20 moles per mole hour of said complex compound in between about 3 and about 20 minutes.

28. A cooling apparatus capable of providing selective intermittent rapid cooling and/or freezing comprising:

(a) a cabinet or container having a cooling chamber therein;

(b) one or more first reactors and one or more second reactors, each of said first reactors containing a first complex compound and each of said second reactors containing a second complex compound different from said first complex compound, said first and second complex compounds formed by adsorbing a polar gas on a metal salt, and in which one or more first and second reactors said polar gas is alternately adsorbed and desorbed on said complex compound, said metal salt comprising a halide, nitrate, nitrite, oxalate, perchlorate, sulfate or sulfite of an alkali metal, alkaline earth metal, transition metal, zinc, cadmium, tin or aluminum, or sodium borofluoride or a double metal chloride, or mixtures thereof, and wherein said complex compound in said one or more first and second reactors is formed by restricting the volumetric expansion thereof during said adsorption of said polar gas on said metal salt, whereby said complex compound is capable of increased reaction rates in the number of moles of said polar gas adsorbed and/or desorbed per mole of said complex compound per hour at adsorption or desorption times of less than 60 minutes, respectively, as compared to a complex compound formed without restricting the volumetric expansion thereof, and wherein said first and second complex compounds are capable of adsorbing and desorbing said polar refrigerant at a rate sufficient to achieve rapid cooling or freezing in about 30 minutes or less, and wherein the equilibrium temperature of said first complex compound differs from the equilibrium temperature of said second complex compound by between about 20° C. and about 150° C. at the same operating pressure, and wherein said one or more first reactors are thermally exposed to said cooling chamber for providing cooling therein, and wherein said one or more second reactors are substantially away from thermal exposure to said cooling chamber; and (c) heating means cooperating with said one or more second reactors for selectively heating the said second complex compound for driving a desorption reaction therein.

29. The cooling apparatus of claim 28 wherein the first complex compound is selected from the group consisting of $BaCl_2.0-8$ ($NH_3$), $CaCl_2.4-8$ ($NH_3$), $CaCl_2.2-4$ ($NH_3$), $SrCl_2.1-8$ ($NH_3$) and $NaBF_4.0.5-2.5$ ($NH_3$).

30. The cooling apparatus of claim 28 wherein the second complex compound is selected from the group consisting of $LiCl.0-3$ ($NH_3$), $SrBr_2.2-8$ ($NH_3$), $CaBr_2.2-6$ ($NH_3$), $CaCl_2.2-4$ ($NH_3$), $CaCl_2.1-2$ ($NH_3$), $CaCl_2.0-1$ ($NH_3$), $CoCl_2.2-6$ ($NH_3$), $SrCl_2.1-8$ ($NH_3$), $NiCl_2.2-6$ ($NH_3$), $FeCl_2.2-6$ ($NH_3$), $SnCl_2.0-2.5$ ($NH_3$), $FeBr_2.2-6$ ($NH_3$) and $NaBF_4.0.5-2.5$ ($NH_3$).

31. The cooling apparatus of claim 29 wherein the second complex compound is selected from the group consisting of $LiCl.0-3$ ($NH_3$), $SrBr_2.2-8$ ($NH_3$), $CaBr_2.2-6$ ($NH_3$), $CaCl_2.2-4$ ($NH_3$), $CaCl_2.1-2$ ($NH_3$), $CaCl_2.0-1$ ($NH_3$), $CoCl_2.2-6$ ($NH_3$), $SrCl_2.1-8$ ($NH_3$), $NiCl_2.2-6$ ($NH_3$), $FeCl_2.2-6$ ($NH_3$), $SnCl_2.0-2.5$ ($NH_3$), and $NaBF_4.0.5-2.5$ ($NH_3$).

32. The apparatus of claim 28 wherein said complex compound in an adsorbed condition is capable of desorbing at least 50% of its polar gas at a rate of at least 8 moles per mole hour of said complex compound in 30 minutes or less.

33. The apparatus of claim 28 wherein said complex compound is capable of adsorbing said polar gas at a rate of at least 20 moles per mole hour of said complex compound in between about 3 and about 20 minutes.

34. A method of operating the cooling apparatus of claim 28 comprising:

charging said cooling apparatus by heating said second complex compound in said one or more second reactors for desorbing said polar gas therefrom and adsorbing said desorbed polar gas on said first complex compound in said one or more first reactors, and selectively discharging said cooling apparatus to provide cooling therein by desorbing said polar gas from said first complex compound in said one or more first reactors, and adsorbing said desorbed polar gas on said second complex compound in said one or more second reactors, said adsorption and said desorption being carried out at a rate sufficient to achieve rapid cooling or freezing in 30 minutes or less.

* * * * *